(12) United States Patent
Pizzuto et al.

(10) Patent No.: US 7,183,160 B2
(45) Date of Patent: Feb. 27, 2007

(54) MANUFACTURING PROCESS FOR A FLASH MEMORY AND FLASH MEMORY THUS PRODUCED

(75) Inventors: Olivier Pizzuto, Fuveau (FR); Romain Laffont, Ch. Chateau Gombert (FR); Jean-Michel Mirabel, Maison de la Colline (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 10/763,044

(22) Filed: Jan. 22, 2004

(65) Prior Publication Data

US 2005/0087816 A1    Apr. 28, 2005

(30) Foreign Application Priority Data

Jan. 22, 2003    (FR) .................................. 03 00681

(51) Int. Cl.
*H01L 21/336*    (2006.01)

(52) U.S. Cl. ..................... 438/262; 438/259; 438/294; 257/315; 257/623

(58) Field of Classification Search ..................... None
See application file for complete search history.

(56) References Cited

U.S. PATENT DOCUMENTS

| | | | |
|---|---|---|---|
| 5,447,877 A | | 9/1995 | Sasaki |
| 5,880,499 A | * | 3/1999 | Oyama ....................... 257/316 |
| 6,103,574 A | | 8/2000 | Iwasaki |
| 6,348,406 B1 | * | 2/2002 | Subramanian et al. ...... 438/636 |
| 6,485,895 B1 | * | 11/2002 | Choi et al. ................... 430/330 |
| 2002/0132425 A1 | | 9/2002 | Song et al. |
| 2003/0122185 A1 | * | 7/2003 | Wang et al. ................. 257/316 |
| 2003/0165750 A1 | * | 9/2003 | Tanaka et al. ................. 430/5 |
| 2003/0194657 A1 | * | 10/2003 | Renaldo et al. ............. 430/315 |

FOREIGN PATENT DOCUMENTS

EP    0 680 080    11/1995

OTHER PUBLICATIONS

S. Wolf and R.N. Tauber, "Silicon Processing for the VLSI Era", 1986, Lattice press, vol. 1, p. 564-565.*
French Preliminary Search Report dated Nov. 6, 2003 for French Application No. 0300681.

* cited by examiner

*Primary Examiner*—Brook Kebede
*Assistant Examiner*—Su C. Kim
(74) *Attorney, Agent, or Firm*—Lisa K. Jorgenson; Jon A. Gibbons; Fleit, Kain, Gibbons, Gutman, Bongini & Bianco P.L.

(57) ABSTRACT

The invention relates to a production process for a flash memory from a semi-conductor substrate fitted with at least two adjacent rows of precursor stacks of floating gate transistors, the precursor stacks being at least partially covered by a protective resin and being separated by a formation zone for a source line. The process includes forming a trench in the formation zone for the source line by an attack of this zone and of the protective resin. The result of the attack step includes a deposit of residue from the resin below the precursor stacks. The residue deposit is removed. A source line is implanted in the formation zone below the precursor stacks. This process enables the time needed for erasing the memory to be reduced.

16 Claims, 4 Drawing Sheets

MANUFACTURING PROCESS FOR A FLASH MEMORY AND FLASH MEMORY THUS PRODUCED

CROSS-REFERENCE TO RELATED APPLICATIONS

This application is based upon and claims priority from prior French Patent Application No. 0300681, filed on Jan. 22, 2003 the entire disclosure of which is herein incorporated by reference.

FIELD OF THE INVENTION

The present invention is generally related to the decoding and more particularly to a particular processes for manufacturing flash memory cells.

BACKGROUND OF THE INVENTION

EPROM memories with floating grill are programmable electrically, but are not erasable electrically. These memories are erasable only by ultraviolet rays. EPROM memories are programmed by using the phenomenon of thermal agitation in the conduction channel under the effect of conventional saturation. This phenomenon is irreversible.

EEPROM memories are programmable and erasable electrically. EEPROM memories are programmed or erased via tunnel effect. Internal memory circuits, such as charge pumps or multipliers, usually produce programming and erasing voltages.

Flash memories are components formed by a matrix of memory cells, each having a transistor with floating gate. In conventional terms, it is possible to individually each program each cell of the matrix, but the data must be erased for a block of cells. Each cell is usually formed from a source, a drain, a floating gate and a control cell. The transistors with floating gate of the matrix are arranged in rows. Forming a source line connects the sources of the transistors of a row. Hot carriers of the drain program the cell. The cell is erased by tunnel effect.

The production process for certain flash memories utilises an etching step known as forming an auto-aligned or SAS source (Self-Aligned Source). The SAS etching digs out source lines in the substrate on which the flash memory is formed. During a subsequent stage of the process arsenic is implanted at a high concentration in the etched zone to form the source line of the transistors with floating gate.

Although useful, Flash memories have disadvantages. One disadvantage is the time required to erase flash memories is considerable, thus limiting their fields of application.

Accordingly, a need exists to overcome these disadvantages with process for a Flash memory.

SUMMARY OF THE INVENTION

Briefly, in accordance with the present invention a production process is disclosed for a flash memory comprising, from a semi-conductor substrate fitted with at least two adjacent rows of precursor stacks of floating gate transistors, the precursor stacks being at least partially covered by a protective resin and being separated by a formation zone for a source line, said process comprising the following stages:

forming a trench in the formation zone for the source line by an attack on this zone and of the protective resin, the result of which is deposit of residue from the resin below the precursor stacks;

subsequently removing the residue deposit subsequently implanting a source line in the formation zone below the precursor stacks.

According to a embodiment, the formation stage of the trench is of the type having an auto-aligned SAS source.

According to another embodiment, the protective resin is made of thick DUV resin.

According to yet another embodiment, the protective resin is made of thick i-line resin.

And according to another embodiment still, the substrate has a drain for each precursor stack of a transistor with floating gate, the drain being arranged opposite the formation zone of the source line relative to its respective stack, the process comprising a previous stage for covering the drain in resin.

Also, the stage consisting of removing the deposit of residue comprises generating dioxygen plasma.

According to a embodiment, the process further comprises a stage comprising removing the protective resin following implantation of the source line.

According to another embodiment, implantation of the source line comprises doping of the formation zone of the source line with arsenic.

According to yet another embodiment, the source line is implanted some 25 nanometer out from the edge under a gate oxide of the precursor stacks of the memory cells.

The invention also relates to a Flash memory having a semi-conductor substrate fitted with an auto-aligned source line and fitted with at least two adjacent rows of transistors with floating gate comprising a gate oxide, the rows being separated by a source line, the source line being implanted some 25 nanometer off the edge under the gate oxide of the transistors.

BRIEF DESCRIPTION OF THE DRAWING

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The invention reduces the time needed to erase a flash memory. For this, polymers deposited under the cell during the attack of a protective resin of the cells are removed during the etching stage of the auto-aligned source. The source line is then implanted in the etched zone.

Figure 1:
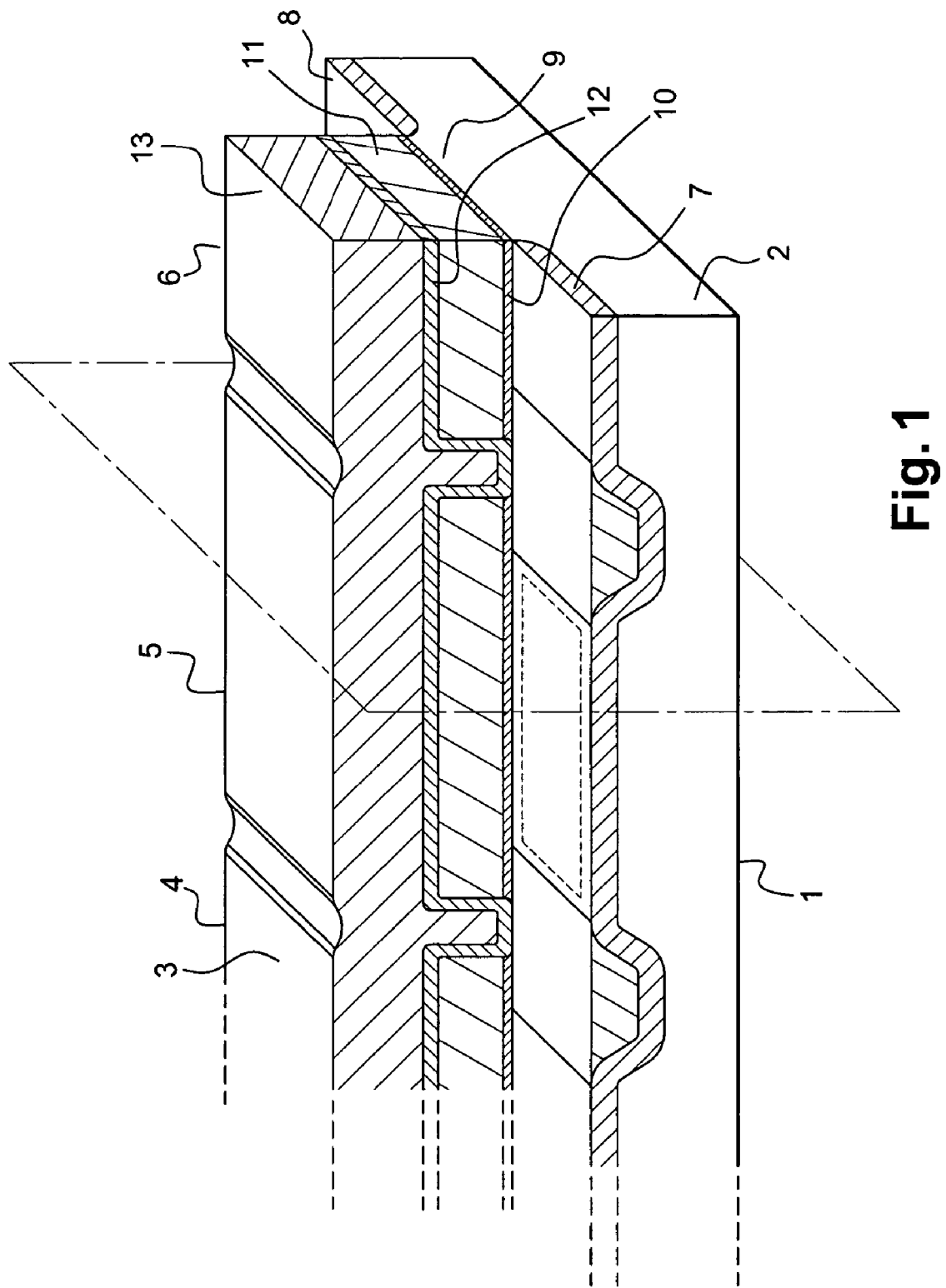
FIG. 1 is a section in perspective of a flash memory in the course of production.

FIG. 1 illustrates schematically and in perspective a portion of a flash memory 1 during production. The memory 1 comprises a substrate 2 on which memory cells are created. FIG. 1 shows a row of memory cells 4, 5, 6. A row of memory cells is formed from a continuous stacked structure 3. The continuous stacked structure shown at 3 is a precursor structure of memory cells formed from transistors with floating gate. A source line 7 and a drain 8 are formed in the substrate 2 on either side of each memory cell 4, 5 or 6. The source line 7 is common to two adjacent rows of memory cells. The substrate 2 can be made of monocrystalline silicon or from any other adequate material. In a manner known to those of average skill in the art, the substrate 2 has a channel 9 whereof the doping is opposed to those of the drain and the source line.

The stacked structure comprises a layer of tunnel oxide 10 having a thickness enabling passage of loads via tunnel effect and created on the substrate 2. A floating gate 11 surmounts this layer of tunnel oxide 10. The floating gate 11 is surmounted by an insulating interpolysilicon 12. This insulating interpolysilicon 12 is surmounted by a control gate 13, and thus insulates the control gate 13 from the floating gate 11.

The layer of tunnel oxide is provided in a manner known to those of average skill in the art to let a tunnel current pass between the source 7 and the floating gate 11 of a cell, when the voltage between the faces of the tunnel oxide 10 exceeds a critical threshold. This voltage corresponds to an electric field of the order of $10.10^6$ V/m. The floating gate is negatively charged by hot electrons and rids itself of electrons by tunnel effect. Stacking the control gate 13 and the floating gate 13 forms a condenser, on the terminals whereof appears a permanent potential difference. The conduction of the formed transistor depends on the charge in the floating gate. When the formed transistor is conducting, the current between the source and the drain depends on the programming state of the cell, determined by the charge. A reference reading voltage is applied to the control gate, then the current is measured and compared to a reference value. The comparison provides binary information on the programming status of the cell. The reference current corresponds to the current obtained for a blank threshold charge voltage of the memory cell. This voltage corresponds to the case where the floating gate is discharged.

FIGS. 2 to 6 illustrate sectional views of a cell memory, along the plane in discontinuous lines as per FIG. 1, at different stages of the production process.

Figure 2:
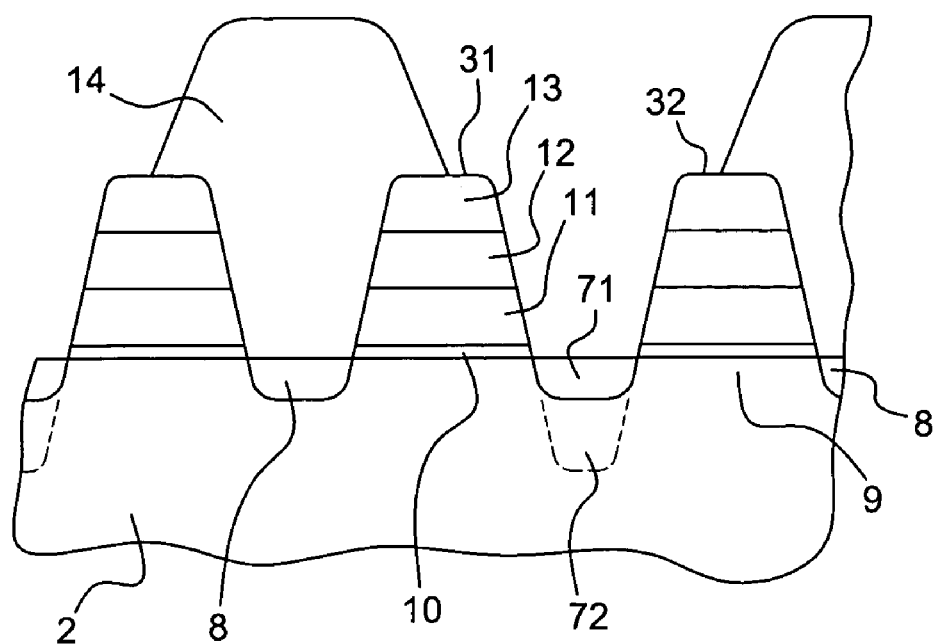
FIGS. 2 to 6 are views in section of the flash memory according to different stages of the production process.

In FIG. 2 the substrate 2 is used fitted with at least two adjacent rows 31 and 32 of precursor stacks of transistors with floating gate. Each stack thus has the layer of tunnel oxide 10, a floating gate 11, the layer of insulating interpolysilicon 12 and the layer of control gate 13. The precursor stacks are at least partially covered in a layer of protective resin 14, forming a mask for the subsequent stages of SAS etching and implantation of the source lines. A thick DUV or i-line resin can specially be used as protective resin. The protective resin has sufficient thickness to avoid implantation in the precursor stacks during formation of the source line. A row of stacks has on one of its sides a zone 71 for the formation for a source line 7, and on the other side of the drains 8. The zone 71 of the source line and the drains 8 are generally doped previously, as shown by the continuous lines. A zone 71 for the formation for a source line separates two adjacent rows of stacks. This zone 71 has, in the direction of the row, alternation between zones close to the tunnel oxide, for forming sources for the respective cells, and more immersed zones 72 relative to the surface of the substrate 2, for insulating the adjacent cells of a row, and shown by discontinuous lines.

Figure 3:
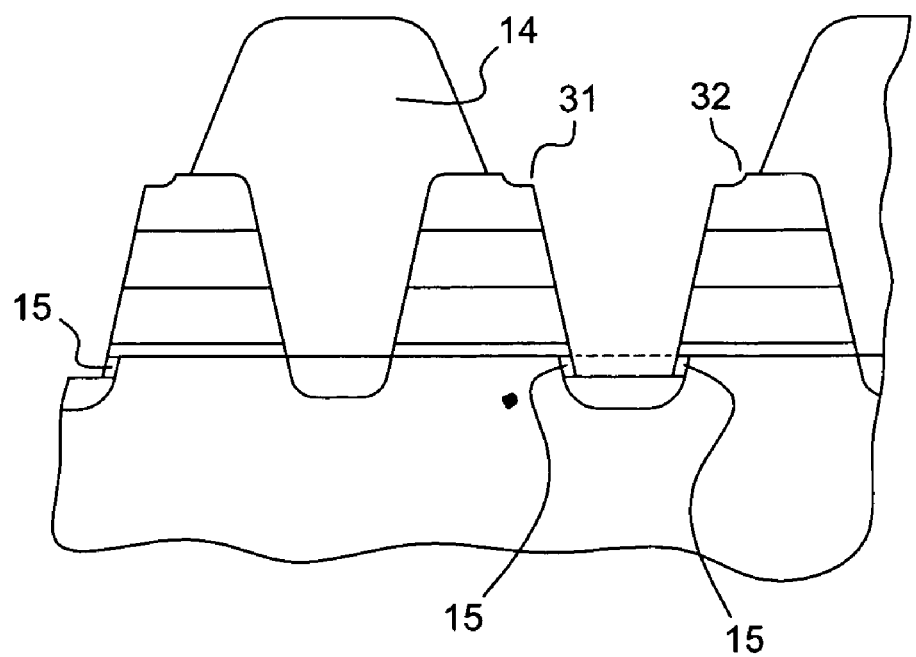

SAS etching is then carried out in a manner known to those of average skill in the art, the result of which is illustrated in FIG. 3. The non-masked zone, corresponding in large part to the zone 71 for the formation for the source line, is etched in this way. The substrate is then dug out under the level of the stack, as shown in discontinuous lines in FIG. 3. Etching can be undertaken in a manner known to those of average skill in the art with products such as CF4 or CHF3. The etching stage likewise partially attacks the protective resin 14, which creates a deposit of polymers 15 in the hollow below the stack.

Figure 4:
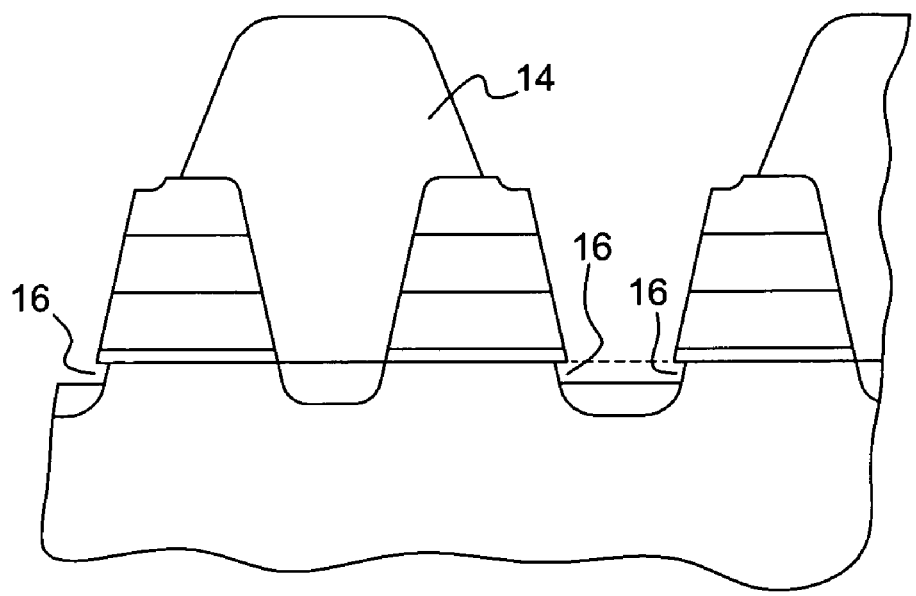

This deposit of polymers 15 was maintained by conventional means during formation for the source line. In the process according to the present invention the deposit of polymers 15 is removed after the SAS etching stage. The polymers can be removed especially by means of adequate dioxygen plasma. The result of this stage is illustrated in FIG. 4. The hollow 16 below the stack is then free of polymer residue. It should be noted that the polymers generally exhibit resistance and a thickness greatly less than those of the resin 14. As a consequence, the stage consisting of removing the polymers does not particularly damage the protective resin 14. The protective resin 14 can then still serve as mask for the subsequent stage of implantation of the source line 7.

Figure 5:
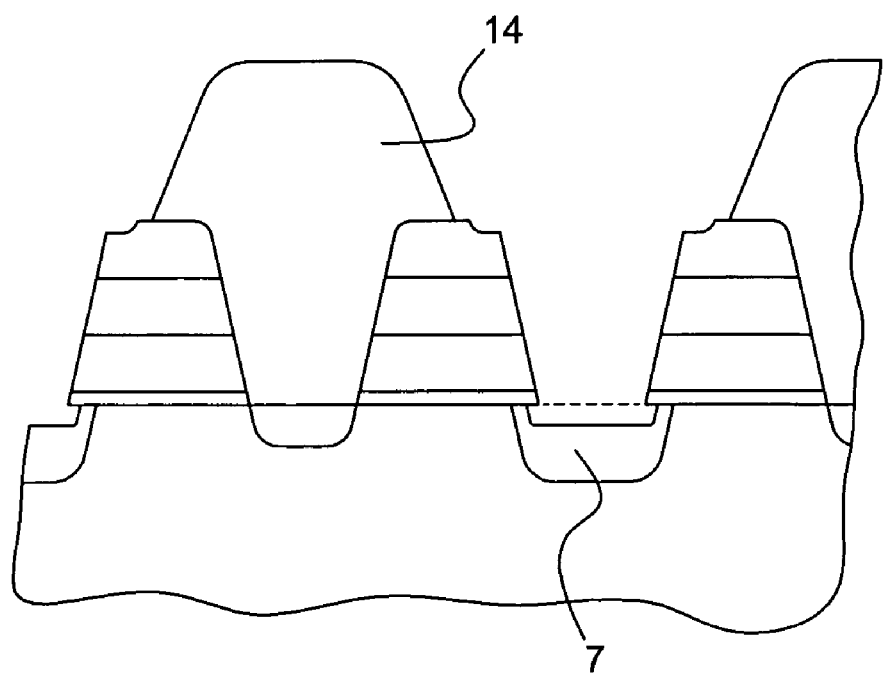

An implantation stage of the source line 7 is then carried out by any adequate means. The source line 7 can be doped in arsenic, in a manner known to those of average skill in the art. Since the doping is done after a hollow 16 is made under the stack, the source line 7 clearly extends under the stack, as shown in FIG. 5. The erasing current between the floating gate 11 and the source line 7 is accordingly increased. The time for erasing the cells can thus be reduced. This current is effectively added to the current between the floating gate and the channel to favor erasing the cell.

The later stages of the process are known to those of average skill in the art. After the source line 7 is implanted, the protective resin 14 is removed. Plasma similar to that used to remove the polymer can be used, as well as H2SO4 humid etching. An adequate plasma treatment period will be used to remove all the resin.

Figure 6:
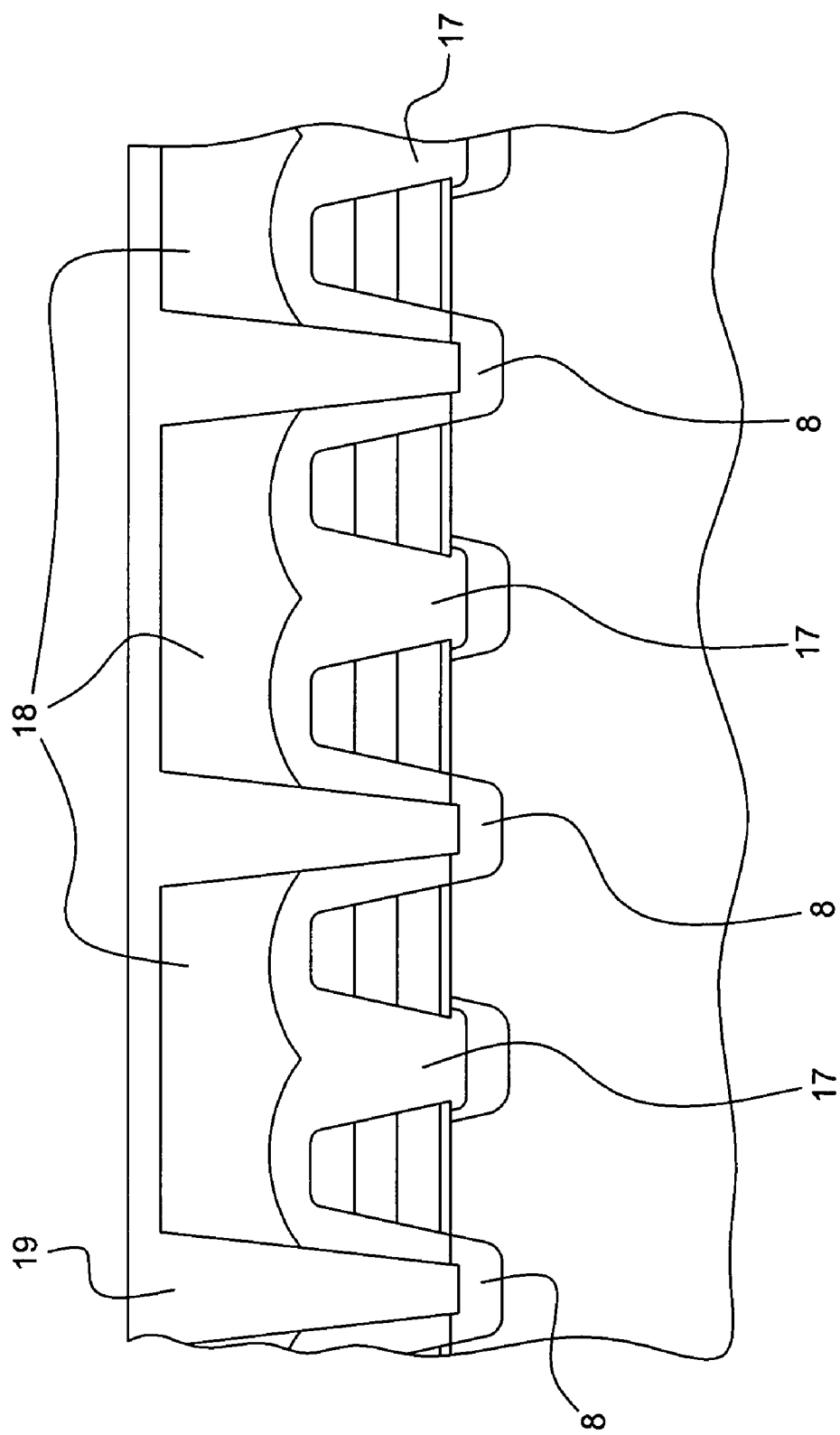

During subsequent stages lateral insulation walls 17 of the cells are formed using any appropriate material. A layer of dielectric material 18 is also formed according to a mask, so as to receive the cells. Then, in a manner known to those of average skill in the art a bit line 19 is created in contact with respective drains 8. The section of FIG. 6 is made along a bit line 19, after formation of the latter.

The Flash memory 1 of this process thus has specific characteristics. The flash memory produced by this process can therefore have a source line 7 extending some 25 nanometers off the edge of the gate oxide 10. Provision can be made preferably that the source line 7 extends some 40 nanometers off the edge of the gate oxide, so as to allow optimal augmentation of the erasing current between the gate oxide 10 and the source line 7.

Tests have been carried out on Flash memories of type T7Y with 0.15 μm technology, manufactured by STMicrolelectronics. The Flash memory of this type, manufactured by a conventional process, has an erasing duration of 400 milliseconds for a threshold voltage Vt equal to 2.7 volts. The Flash memory of this type, made by the process according to the present invention, has an erasing duration of 355 milliseconds for a threshold voltage Vt likewise equal to 2.7 volts. The memory erasing time is thus reduced, while only moderately modifying the manufacturing process.

The expert will preferably increase the width of the cell between the source line and the drain. In effect, the process according to the present invention implants the source line relatively far under the cell, and thus has the tendency to reduce the width of the channel. The increase of the width of the cell is thus preferably selected to maintain an optimal channel width for functioning of the cell.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method for producing a flash memory comprising:
    forming at least two adjacent rows of precursor stacks of floating gate transistors on a semiconductor substrate, with the precursor stacks being at least partially covered by a protective resin and being separated by a formation zone for a source line, wherein the forming at least two adjacent rows of precursor stacks of floating gate transistors on a semiconductor substrate includes forming a semiconductor substrate with a drain for each precursor stack,
    wherein the drain is covered in a resin; and
    wherein for each of the precursor stacks, the drain is formed opposite the formation zone for the source line;
    forming a trench in the formation zone for the source line by an attack of the formation zone and of the protective resin so as to result in a deposit of residue from the protective resin below the precursor stacks, wherein the forming a trench includes forming a trench so as to result in the protective resin formed of thick i-line resin;
    removing the deposit of residue; and
    implanting a source line in the formation zone, with at least a portion of the source line extending directly below the precursor stacks.

2. The method of claim 1, wherein the forming a trench includes forming a trench which is a type having a (SAS) self-aligned source.

3. The method of claim 1, wherein the forming a trench includes forming a trench so as to result in the protective resin formed from a thick (DUV) Deep Ultraviolet resin.

4. The method of claim 1, wherein the removing the deposit of residue includes removing the deposit of residue by generating dioxygen plasma.

5. The method of claim 2, wherein the removing the deposit of residue includes removing the deposit of residue by generating dioxygen plasma.

6. The method of claim 2, further comprising:
    removing the protective resin following implantation of the source line.

7. The method of claim 1, further comprising:
    removing the protective resin following implantation of the source line.

8. The method of claim 1, wherein the implanting the source line includes doping the source line with arsenic.

9. The method of claim 1, wherein the implanting the source line includes implanting the source line 25 nanometers out from an edge under a gate oxide of the precursor stacks.

10. A method for producing a flash memory comprising:
    forming at least two adjacent rows of precursor stacks of floating gate transistors on a semiconductor substrate, with the precursor stacks being at least partially covered by a protective resin and being separated by a formation zone for a source line, wherein the forming at least two adjacent rows of precursor stacks of floating gate transistors on a semiconductor substrate includes forming a semiconductor substrate with a drain for each precursor stack,
    wherein the drain is covered in a resin; and
    wherein for each of the precursor stacks, the drain is formed opposite the formation zone for the source line;
    forming a trench in the formation zone for the source line by an attack of the formation zone and of the protective resin so as to result in a deposit of residue from the protective resin below the precursor stacks, wherein the forming a trench includes forming a trench which is a type having a (SAS) self-aligned source;
    removing the deposit of residue; and
    implanting a source line in the formation zone, with at least a portion of the source line extending directly below the precursor stacks.

11. The method of claim 10, wherein the forming a trench includes forming a trench so as to result in the protective resin formed from a thick (DUV) Deep Ultraviolet resin.

12. The method of claim 11, further comprising:
    removing the protective resin following implantation of the source line.

13. The method of claim 11, wherein the removing the deposit of residue includes removing the deposit of residue by generating dioxygen plasma.

14. The method of claim 10, wherein the removing the deposit of residue includes removing the deposit of residue by generating dioxygen plasma.

15. The method of claim 14, further comprising:
    removing the protective resin following implantation of the source line.

16. The method of claim 10, further comprising:
    removing the protective resin following implantation of the source line.

* * * * *